(12) United States Patent
Lee et al.

(10) Patent No.: US 8,448,048 B2
(45) Date of Patent: May 21, 2013

(54) FLASH MEMORY DEVICE AND RELATED PROGRAMMING METHOD

(75) Inventors: Ki jun Lee, Seoul (KR); Hong Rak Son, Anyang-si (KR); Jun jin Kong, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 465 days.

(21) Appl. No.: 12/769,692

(22) Filed: Apr. 29, 2010

(65) Prior Publication Data

US 2011/0093765 A1 Apr. 21, 2011

(30) Foreign Application Priority Data

Oct. 21, 2009 (KR) .................. 10-2009-0100234

(51) Int. Cl.
*G11C 29/00* (2006.01)
(52) U.S. Cl.
USPC ........................................................ 714/773
(58) Field of Classification Search ................... 714/773; 365/185.09
See application file for complete search history.

(56) References Cited

U.S. PATENT DOCUMENTS

| | | | |
|---|---|---|---|
| 7,257,066 B2 | 8/2007 | Fujiwara et al. | |
| 7,830,708 B1 * | 11/2010 | Jung et al. | 365/185.03 |
| 8,245,101 B2 * | 8/2012 | Olbrich et al. | 714/753 |
| 2008/0133986 A1 * | 6/2008 | Vainsencher et al. | 714/719 |
| 2008/0151704 A1 | 6/2008 | Harada | |
| 2008/0209111 A1 * | 8/2008 | Kang | 711/103 |

FOREIGN PATENT DOCUMENTS

| | | |
|---|---|---|
| JP | 2002358740 A | 12/2002 |
| JP | 2008159184 A | 7/2008 |
| KR | 1020080079510 A | 9/2008 |

* cited by examiner

*Primary Examiner* — Scott Baderman
*Assistant Examiner* — Neil Miles
(74) *Attorney, Agent, or Firm* — Volentine & Whitt, PLLC

(57) ABSTRACT

A nonvolatile memory device comprises a memory cell array configured to store one or more bits per memory cell, a read and write circuit configured to access the memory cell array, a control logic component configured to control the read and write circuit to sequentially execute read operations of a selected memory cell at least twice to output a read data symbol, and an error correcting unit configured to correct an error in the read data symbol based on a pattern of the read data symbol to output an error-corrected symbol.

18 Claims, 18 Drawing Sheets

| Read Voltage \ Vth | VA1 | VA2 | VA3 | VA4 | VA5 | VA6 | VA7 | VA8 |
|---|---|---|---|---|---|---|---|---|
| Vr1 | 0 | 1 | 1 | 1 | 1 | 1 | 1 | 1 |
| Vr2 | 0 | 0 | 1 | 1 | 1 | 1 | 1 | 1 |
| Vr3 | 0 | 1 | 0 | 1 | 1 | 1 | 1 | 1 |
| Vr4 | 0 | 0 | 0 | 0 | 1 | 1 | 1 | 1 |
| Vr5 | 0 | 0 | 0 | 0 | 0 | 1 | 1 | 1 |
| Vr6 | 0 | 0 | 1 | 0 | 1 | 0 | 1 | 1 |
| Vr7 | 0 | 0 | 0 | 0 | 0 | 0 | 0 | 1 |
| # of 1 | 0 | E | E | 3 | E | 5 | 6 | 7 |

Fig. 3

| Read Voltage \ Vth | VA1 | VA2 | VA3 | VA4 | VA5 | VA6 | VA7 | VA8 |
|---|---|---|---|---|---|---|---|---|
| Vr1 | 0 | 1 | 1 | 1 | 1 | 1 | 1 | 1 |
| Vr2 | 0 | 0 | 1 | 1 | 1 | 1 | 1 | 1 |
| Vr3 | 0 | 0 | 0 | 1 | 1 | 1 | 1 | 1 |
| Vr4 | 0 | 0 | 0 | 0 | 1 | 1 | 1 | 1 |
| Vr5 | 0 | 0 | 0 | 0 | 0 | 1 | 1 | 1 |
| Vr6 | 0 | 0 | 0 | 0 | 0 | 0 | 1 | 1 |
| Vr7 | 0 | 0 | 0 | 0 | 0 | 0 | 0 | 1 |
| # of 1 | 0 | 1 | 2 | 3 | 4 | 5 | 6 | 7 |

Fig. 4

| Read Voltage \ Vth | VA1 | VA2 | VA3 | VA4 | VA5 | VA6 | VA7 | VA8 |
|---|---|---|---|---|---|---|---|---|
| Vr1 | 0 | 1 | 1 | 1 | 1 | 1 | 1 | 1 |
| Vr2 | 0 | 0 | 1 | 1 | 1 | 1 | 1 | 1 |
| Vr3 | 0 | 1 | 0 | 1 | 1 | 1 | 1 | 1 |
| Vr4 | 0 | 0 | 0 | 0 | 1 | 1 | 1 | 1 |
| Vr5 | 0 | 0 | 0 | 0 | 0 | 1 | 1 | 1 |
| Vr6 | 0 | 0 | 1 | 0 | 1 | 0 | 1 | 1 |
| Vr7 | 0 | 0 | 0 | 0 | 0 | 0 | 0 | 1 |
| # of 1 | 0 | E | E | 3 | E | 5 | 6 | 7 |

Fig. 11

| Read data symbol | 3-Bit symbol |
|---|---|
| 0000000 | 000 |
| 1000000 | 001 |
| 1100000 | 010 |
| 1110000 | 011 |
| 1111000 | 100 |
| 1111100 | 101 |
| 1111110 | 110 |
| 1111111 | 111 |

FLASH MEMORY DEVICE AND RELATED PROGRAMMING METHOD

STATEMENT OF RELATED APPLICATIONS

This application claims priority under 35 U.S.C. §119 to Korean Patent Application 10-2009-0100234 filed on Oct. 21, 2009, the disclosure of which is hereby incorporated by reference in its entirety.

BACKGROUND

Semiconductor memory devices are a major component of modern electronic devices. They can be found, for instance, in computers, portable communication devices, and embedded systems, to name but a few.

Semiconductor memory devices can be categorized as volatile or nonvolatile based on whether they retain stored data when disconnected from power. Volatile semiconductor memory devices do not retain stored data when disconnected from power, while nonvolatile semiconductor memory devices do retain stored data when disconnected from power. Examples of volatile semiconductor memory devices include static random access memory (SRAM), dynamic random access memory (DRAM), and synchronous DRAM (SDRAM). Examples of Nonvolatile semiconductor memory devices include read only memory (ROM), programmable ROM (PROM), electrically programmable ROM (EPROM), electrically erasable and programmable ROM (EEPROM), flash memory, phase change RAM (PRAM), magnetoresistive RAM (MRAM), resistive RAM (RRAM), and ferroelectric RAM (FRAM).

Flash memory has gained popularity in recent years due at least to the proliferation of portable electronic devices requiring nonvolatile data storage or kinetic shock resistance. There are two major categories of flash memory with varied configurations and operating principles, known as NAND flash memory and NOR flash memory. NAND flash memories tend to have greater integration density and faster erase and write times compared with NOR flash memories, while NOR flash memories tend to have faster read times.

Because of their different performance characteristics NAND and NOR flash memories may be used for different purposes. For instance, NOR flash memory is commonly used to store information requiring fast access, such as program code due to its fast read time, while NAND is commonly used to provide mass data storage due to its high integration density.

SUMMARY

Embodiments of the inventive concept provide flash memory devices and related programming methods capable of reducing programming or read errors.

According to one embodiment of the inventive concept, a nonvolatile memory device comprises a memory cell array configured to store one or more bits per memory cell, a read and write circuit configured to access the memory cell array, a control logic configured to control the read and write circuit to execute read operations of a selected memory cell at least twice to output a read data symbol, and an error correcting unit configured to correct an error of the read data symbol based on a pattern of the read data symbol, and output an error-corrected symbol.

According to another embodiment of the inventive concept, a memory system comprises a nonvolatile memory device, and a controller configured to control the nonvolatile memory device, wherein the nonvolatile memory device comprises a memory cell array configured to store one or more bits per memory cell, a read and write circuit configured to access the memory cell array, a control logic configured to control the read and write circuit to sequentially execute read operations of a selected memory cell at least twice to output a read data symbol, and an error correcting unit configured to correct an error of the read data symbol based on a pattern of the read data symbol to output an error-corrected symbol, wherein the controller comprises a soft decision logic configured to determine data of the selected memory cell by soft decision of the error-corrected symbol.

According to still another embodiment of the inventive concept, a method of reading a nonvolatile memory device comprises reading a selected memory cell at least twice to obtain a read data symbol, and correcting an error of the read data symbol based on a pattern of the read data symbol to obtain a error-corrected symbol.

BRIEF DESCRIPTION OF THE DRAWINGS

Embodiments of the inventive concept will be more clearly understood from the following detailed description taken in conjunction with the accompanying drawings. In the drawings, like reference numbers denote like features.

FIG. 3 illustrates read data symbols generated by applying first through seventh read voltages Vr1-Vr7 to selected memory cells.

FIG. 4 illustrates errors that may occur in the read data symbols of FIG. 3.

FIG. 11 illustrates various patterns of 3-bit symbols according the patterns shown in FIG. 3.

DETAILED DESCRIPTION OF THE EMBODIMENTS

Various embodiments will be described more fully hereinafter with reference to the accompanying drawings. The inventive concept may, however, be embodied in many different forms and should not be construed as being limited to only the illustrated embodiments. Rather, these embodiments are presented as teaching examples.

Figure 1:
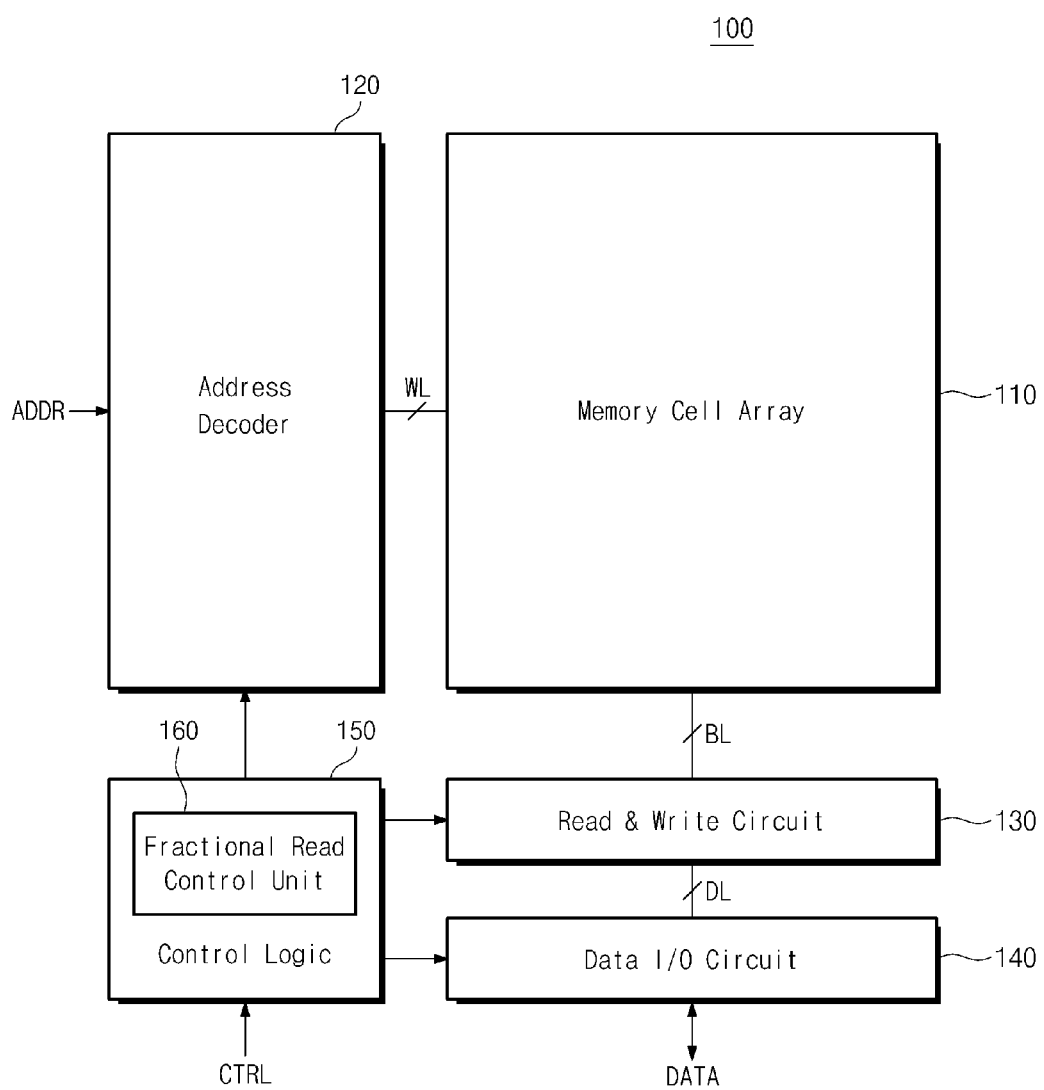
FIG. 1 is a block diagram illustrating a nonvolatile memory device according to an embodiment of the inventive concept.

FIG. 1 is a block diagram illustrating a nonvolatile memory device 100 according to an embodiment of the inventive concept. Referring to FIG. 1, nonvolatile memory device 100 comprises a memory cell array 110, an address decoder 120, a read and write circuit 130, a data input and output (I/O) circuit 140 and a control logic component 150.

Memory cell array 110 is connected to address decoder 120 via word lines WL and connected to read and write circuit 130 via bit lines BL. Memory cell array 110 comprises a plurality of memory cells arranged in rows and columns. The memory cells are connected to word lines WL in the row direction and to bit lines BL in the column direction. In some embodiments, memory cell array 110 is configured to store one or more bits per memory cell.

Address decoder 120 is connected to memory cell array 110 via word lines WL and operates under the control of control logic component 150. Address decoder 120 receives and decodes an address ADDR to produce row and column addresses of selected cells. Address decoder 120 selects one or more word lines WL based on the row address, and transfers the column address to read and write circuit 130. Address decoder 120 typically comprises elements such as a row decoder, a column decoder, and an address buffer.

Read and write circuit 130 operates under the control of control logic component 150, is connected to memory cell array 110 via bit lines BL, and is further connected to data I/O circuit 140 via data lines DL. Read and write circuit 130 receives the decoded column address from address decoder 120 and selects one or more of bit lines BL based on the decoded row address.

Read and write circuit 130 also receives data from data I/O circuit 140, and writes the received data into memory cell array 110. Read and write circuit 130 reads data from memory cell array 110 and transfers the read data to data I/O circuit 140. Read and write circuit 130 may also read data from a first storage area of memory cell array 110 and write the read data into a second storage area of memory cell array 110. In other words, read and write circuit 130 may also execute a copyback operation.

Read and write circuit 130 typically comprises elements such as a page buffer or page register, and a column selection circuit. Read and write circuit 130 may also comprise elements such as a write driver, a sense amplifier, and a column selection circuit.

Data I/O circuit 140 operates under the control of control logic component 150 and provides input/output functions for nonvolatile memory device 100. Data I/O circuit 140 transfers data DATA to and from read and write circuit 130 via data lines DL. Data I/O circuit 140 typically comprises elements such as a data buffer.

Control logic component 150 is connected to address decoder 120, read and write circuit 130, and data I/O circuit 140. Control logic component 150 is configured to control various operations of nonvolatile memory device 100. Control logic component 150 operates in response to a control signal CTRL received from an external source.

Control logic component 150 comprises a fractional read control unit 160. Fractional read control unit 160 is configured to control a fractional read operation of nonvolatile memory device 100. The function of fractional read control unit 160 is described in further detail with reference to FIGS. 2 and 3.

Fractional read control unit 160 typically comprises a digital circuit, an analog circuit, or a combination of digital and analog circuits. Fractional read control unit 160 may also, or alternatively, comprise software executed by control logic component 150, or it may comprise a combination of hardware and software.

Figure 2:
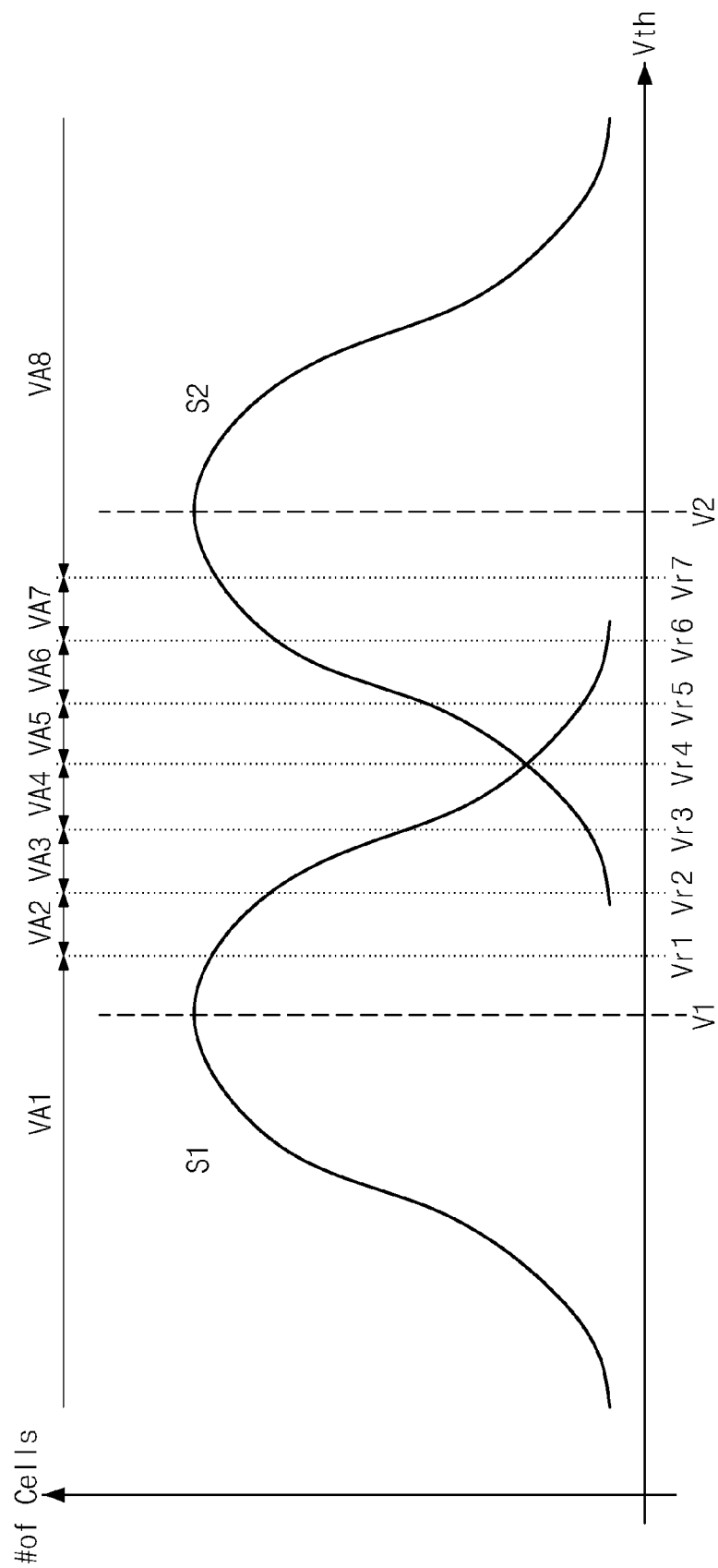
FIG. 2 is a diagram illustrating threshold voltage distributions of memory cells in a memory cell array shown in FIG. 1.

FIG. 2 is a diagram illustrating threshold voltage distributions of memory cells in memory cell array 110. In FIG. 2, the horizontal axis measures threshold voltage and the vertical axis represents a number of memory cells having each threshold voltage.

The two threshold voltage distributions in FIG. 2 correspond to first and second states S1 and S2 of memory cells in memory cell array 110. The threshold voltage distribution corresponding to state S1 has a peak centered on a first voltage V1, and the threshold voltage distribution corresponding to state S2 has a peak centered on a second voltage V2.

Memory cells having two states store one bit of data. In alternative embodiments, memory cells may have additional states to store more than one bit of data. Additionally, in alternative embodiments, memory cells may store data using a characteristic other than threshold voltage. For instance, a resistance value or other measure could be used to determine the state of a particular memory cell and the resistance value or other measure could be plotted on the horizontal axis.

In the illustrated embodiments, it will be assumed that first state S1 corresponds to a logical '0' and second state S2 corresponds to a logical '1'. In other embodiments, however, first and second states S1 and S2 could correspond to logical '1' and '0', respectively.

Referring to FIGS. 1 and 2, fractional read control unit 160 is configured to control a fractional read operation. During the fractional read operation, fractional read control unit 160 controls read and write circuit 130 to read selected memory cells at least twice. In general, fractional read control unit 160 controls read and write circuit 130 to conduct a j-bit fractional read. During the j-bit fractional read, read and write circuit 130 reads a selected memory cell $2^j-1$ times to generate $2^j-1$ read bits constituting a read data symbol.

FIG. 2 illustrates a 3-bit fractional read operation in which a selected memory cell is read seven times to generate seven-bit read data symbols. Although FIG. 2 illustrates a 3-bit fractional read operation, fractional read operations of different bit-order could be performed in other embodiments.

During the fractional read operation, fractional read control unit 160 controls a voltage generator to sequentially apply first through seventh read voltages Vr1-Vr7 to a selected memory cell. Read data corresponding to first through seventh read voltages Vr1-Vr7 constitute a read data symbol. Accordingly, the 3-bit fractional read operation of the selected memory cell generates a seven bit read data symbol.

FIG. 3 illustrates possible read data symbols that may be generated by a 3-bit fractional read operation. In FIG. 3, the horizontal axis represents threshold voltage ranges, or areas VA1-VA8, and the vertical axis represents read voltages Vr1-Vr7 applied to the selected memory cell.

Where the selected memory cell has a threshold voltage within voltage area VA1 and read voltages Vr1-Vr7 are applied to the selected memory cell in a fractional read operation, a read data symbol is generated with seven zeros, as shown in column VA1 of FIG. 3. In other words, the selected memory cell is turned on when each of read voltages Vr1-Vr7 are applied thereto because each of read voltages Vr1-Vr7 exceeds the threshold voltage of the selected memory cell.

Similarly, where the selected memory cell has a threshold voltage within any of voltage areas VA2-VA8, a 3-bit fractional read operation using read voltages Vr1-Vr7 generates a read data symbol indicated by the corresponding column shown in FIG. 3. Following a fractional read operation, the read data symbols shown in FIG. 3 are processed by a subsequent operation such as a soft decision.

FIG. 4 illustrates three errors that have occurred in the read data symbols of FIG. 3. These errors are indicated by shading. The first error occurs where the selected memory cell has a threshold voltage corresponding to second voltage area VA2 and third read voltage Vr3 is applied to the selected memory cell. The second error occurs where the selected memory cell has a threshold voltage corresponding to third voltage area VA3 and sixth read voltage Vr6 is applied to the selected memory cell. The third error occurs where the selected memory cell has a threshold voltage corresponding to fifth voltage area VA5 and sixth read voltage Vr6 is applied to the selected memory cell.

Where the read data symbol has an error bit, a malfunction may arise during a subsequent processes. To address this problem, a function may be implemented to correct such fractional read errors.

Figure 5:
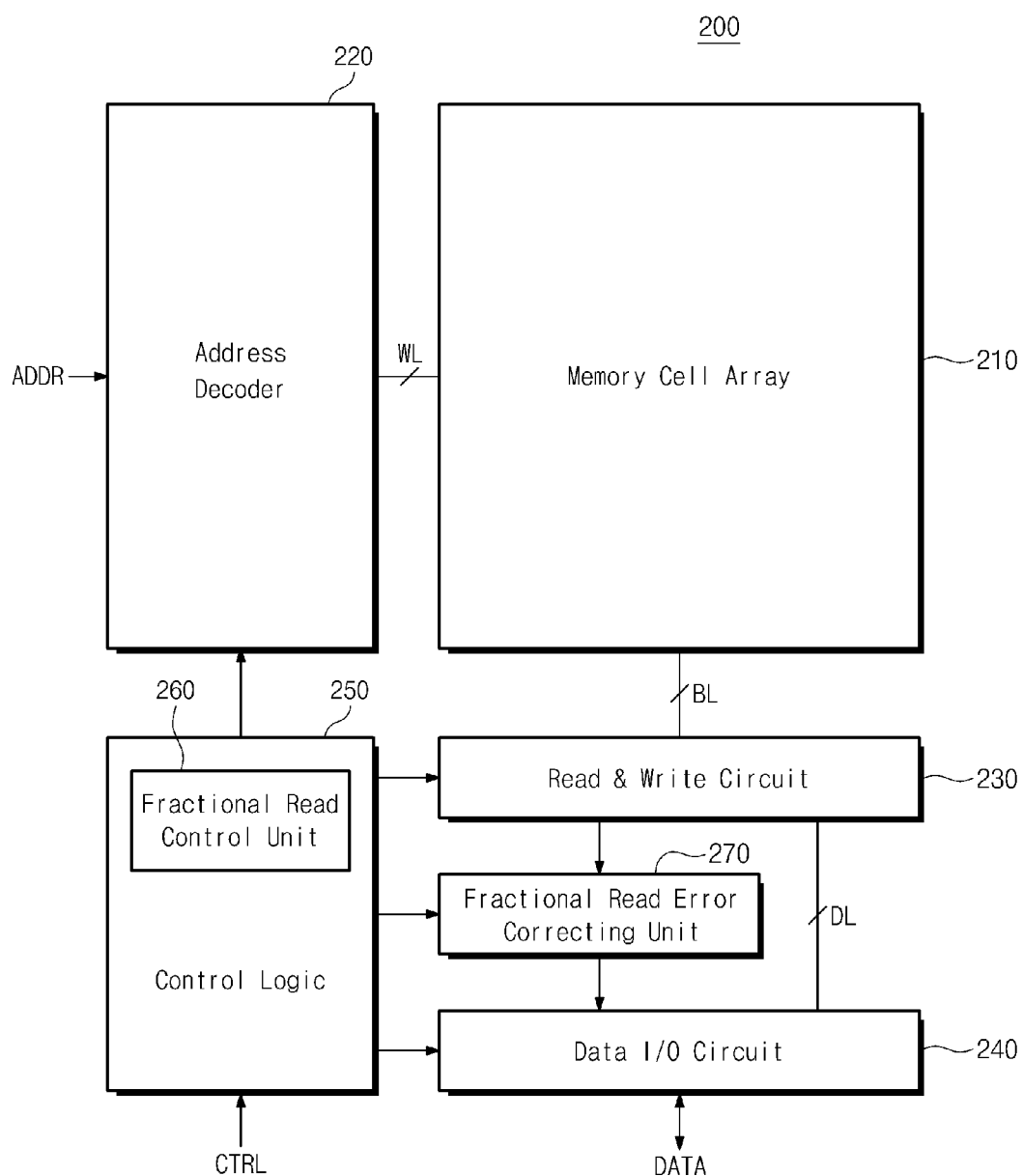
FIG. 5 is a block diagram illustrating a nonvolatile memory device according to another embodiment of the inventive concept.

FIG. 5 is a block diagram illustrating a nonvolatile memory device 200 according to another embodiment of the inventive concept. Referring to FIG. 5, nonvolatile memory device 200 comprises a memory cell array 210, an address decoder 220, a read and write circuit 230, a data I/O circuit 240, a control logic component 250 and a fractional read error correcting unit 270.

Memory cell array 210 and address decoder 220 are substantially identical to memory cell array 110 and address decoder 120, respectively. Thus, a detailed description of these features is omitted to avoid redundancy.

Like read and write circuit 130, read and write circuit 230 is configured to write data into memory cell array 210 and read data from memory cell array 210. Read and write circuit 230 transfers write and read data to and from data I/O circuit 240 via data lines DL. During fractional read operations, read and write circuit 230 transfers read data symbols to fractional read error correcting unit 270.

Fractional read error correcting unit 270 operates under the control of control logic component 250 and is configured to correct errors in read data symbols received from read and write circuit 230. Fractional read error correcting unit 270 corrects errors in read data symbols transfers an error-corrected read data symbols to data I/O circuit 240. Thereafter, succeeding processes such as soft decisions are executed. Thus, malfunctions of the succeeding processes can be prevented.

Fractional read error correcting unit 270 is typically configured to correct errors in a read data symbol based on a pattern of the read data symbol. For instance, as illustrated in FIGS. 2 and 3, when a threshold voltage of the selected memory cell corresponds to a k-th voltage area VAk, first through (k−1)th bits of the read data symbol, which are read normally, have a value of '1' respectively, and remaining bits have a value of '0' respectively. Based on this pattern of the read data symbol, fractional read error correcting unit 270 corrects errors of the read data symbol. For example, fractional read error correcting unit 270 may detect a transition bit of the read data symbol. Based on the detected transition bit, fractional read error correcting unit 270 may correct errors of the read data symbol.

Figure 6:
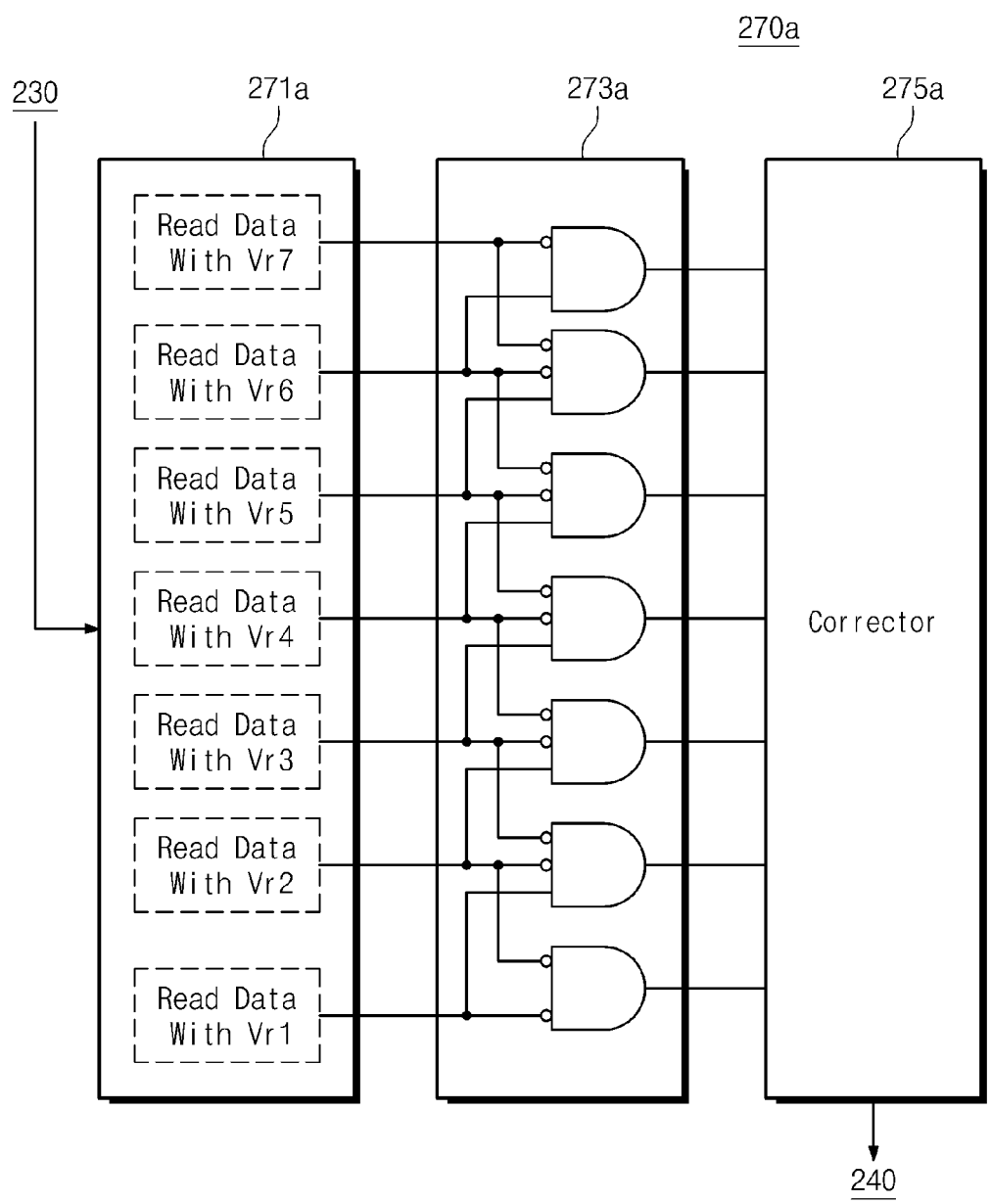
FIG. 6 is a block diagram illustrating an embodiment of a fractional read error correcting unit shown in FIG. 5.

FIG. 6 is a block diagram illustrating an embodiment of fractional read error correcting unit 270. Referring to FIGS. 5 and 6, fractional read error correcting unit 270a comprises a register 271a, a detector 273a and a corrector 275a.

Register 271a is configured to store the read data symbol received from read and write circuit 230. Detector 273a is configured to detect a transition bit of the read data symbol stored in register 271a. The transition bit indicates a bit where the read data symbol transitions from '1' to '0'. For instance, in FIG. 3, the read data symbol in column VA2 has a transition bit as its first bit.

In some embodiments, detector 273a is configured to execute a logical product (AND) operation of an (n−1)th bit, a complement of an n-th bit, and a complement of an (n+1)th bit of the read data symbol. Where an (n−1)th bit of the read data symbol is '1', an n-th bit of the read data symbol is '0', and an (n+1)th bit of the read data symbol is '0', detector 273a sets an output corresponding to the n-th bit of the read data symbol to '1'. Where all bits of the read data symbol are '1', detector 273a sets all outputs into '0'. Where all bits of the read data symbol are '0', detector 273a sets an output corresponding to data read with first read voltage Vr1 to '1', and the remaining outputs bits to '0'.

Corrector 275a is configured to correct errors of the read data symbol based on the outputs of detector 273a. Corrector 275a recognizes a location of the transition bit based on the outputs of detector 273a. Furthermore, corrector 275a recognizes whether all bits of the read data symbol are '0' or '1' based on the outputs of detector 273a. In some embodiments, corrector 275a corrects the value of a detected transition bit of the read data symbol to '1' and corrects values of remaining bits of the read data symbol to '0'. The corrected bits are transferred to data I/O circuit 240 as an error-corrected symbol. In other embodiments, corrector 275a stores the patterns of read data symbols shown in FIG. 3, and selects one of the stored patterns as an error corrected symbol based on the outputs of detector 273a and corrector 275a. For example, corrector 275a may configured to select a pattern based on a location of the transition bit. The selected pattern may then be transferred to data I/O circuit 240 as the error-corrected symbol.

Figure 7:
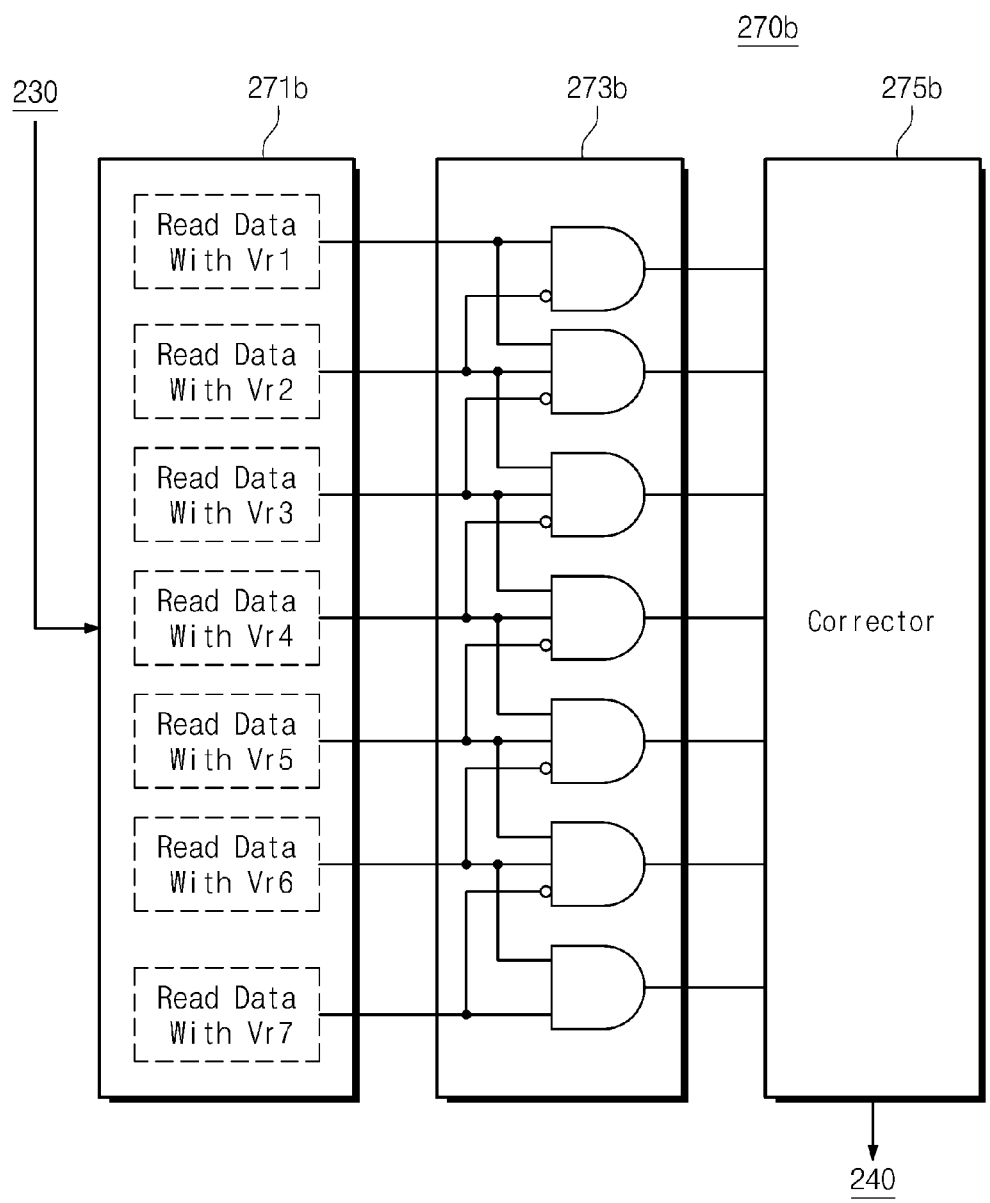
FIG. 7 is a block diagram illustrating another embodiment of the fractional read error correcting unit shown in FIG. 5.

FIG. 7 is a block diagram illustrating a second embodiment of fractional read error correcting unit 270. Referring to FIGS. 5 and 7, fractional read error correcting unit 270b comprises a register 271b, a detector 273b and a corrector 275b.

Register 271b is configured to store the read data symbol received from read and write circuit 230 during the fractional read. Detector 273b is configured to detect a transition bit of the read data symbol stored in register 271b. The transition bit indicates a bit where the read data symbol transitions from '1' to '0'. In an embodiment, detector 273b is configured to execute a logical product (AND) of an (n−1)th bit, an n-th bit, and a complement of an (n+1)th bit of the read data symbol.

Where an (n−1)th bit of the read data symbol is '1', an n-th bit of the read data symbol is '1', and an (n+1)th bit of the read data symbol is '0', detector 273b sets an output corresponding to the n-th bit of the read data symbol to '1'. Where all bits of the read data symbol are to '1', detector 273b sets an output corresponding to first read voltage Vr1 (i.e. a first bit of the read data symbol) to '1', and remaining bits to '0'. Where all bits of the read data symbol correspond to '0', detector 273b sets all outputs into '0'.

Corrector 275b is configured to correct errors of the read data symbol based on the outputs of detector 273b. Corrector 275b recognizes a location of the transition bit based on the outputs of detector 273b. Furthermore, corrector 275b recognizes whether all bits of the read data symbol are '0' or '1' based on the outputs of detector 273b. In some embodiments, corrector 275b corrects values of a first bit to the detected transition bit of the read data symbol to '1' and corrects values of remaining bits of the read data symbol to '0'. The corrected bits are transferred to data I/O circuit 240 as the error-corrected symbol.

In another embodiment, corrector 275b is configured to store the patterns of the read data symbol shown in FIG. 3. Based on the outputs of detector 273b, corrector 275b is configured to select one of the stored patterns of the read data symbol. For example, corrector 275b is configured to select a pattern based on a location of the transition bit. The selected pattern is transferred to data I/O circuit 240 as the error-corrected symbol.

In some embodiments, fractional read error correcting unit 270 to comprises fractional read error correcting units 270a and 270b illustrated in FIGS. 6 and 7. For example, in some embodiments, fractional read error correcting unit 270 is configured to selectively operate one of the fractional read error correcting units 270a and 270b of FIGS. 6 and 7. To do so, fractional read error correcting unit 270 may operate both of fractional read error correcting units 270a and 270b of FIGS. 6 and 7, and combine outputs of the fractional read error correcting units 270a and 270b. Based on the combined outputs, fractional read error correcting unit 270 may correct errors of the read data symbol.

In some embodiments, fractional read error correcting unit 270 calculates likelihoods of the read data symbol patterns, such as those shown in FIG. 3, based on observed patterns. For instance, fractional read error correcting unit 270 may calculate similarities of an actual read data symbol with the patterns shown in FIG. 3. Based on the calculated likelihoods, fractional read error correcting unit 270 may correct errors in the read data symbol. More concretely, fractional read error correcting unit 270 may calculate the likelihood of an actual read data symbol given an observed read data symbol by comparing the observed read data symbol with the patterns shown in FIG. 3. Then, fractional read error correcting unit 270 may select a pattern corresponding to a highest calculated likelihood. The selected pattern is transferred to data I/O circuit 240 as the error-corrected symbol.

Figure 8:
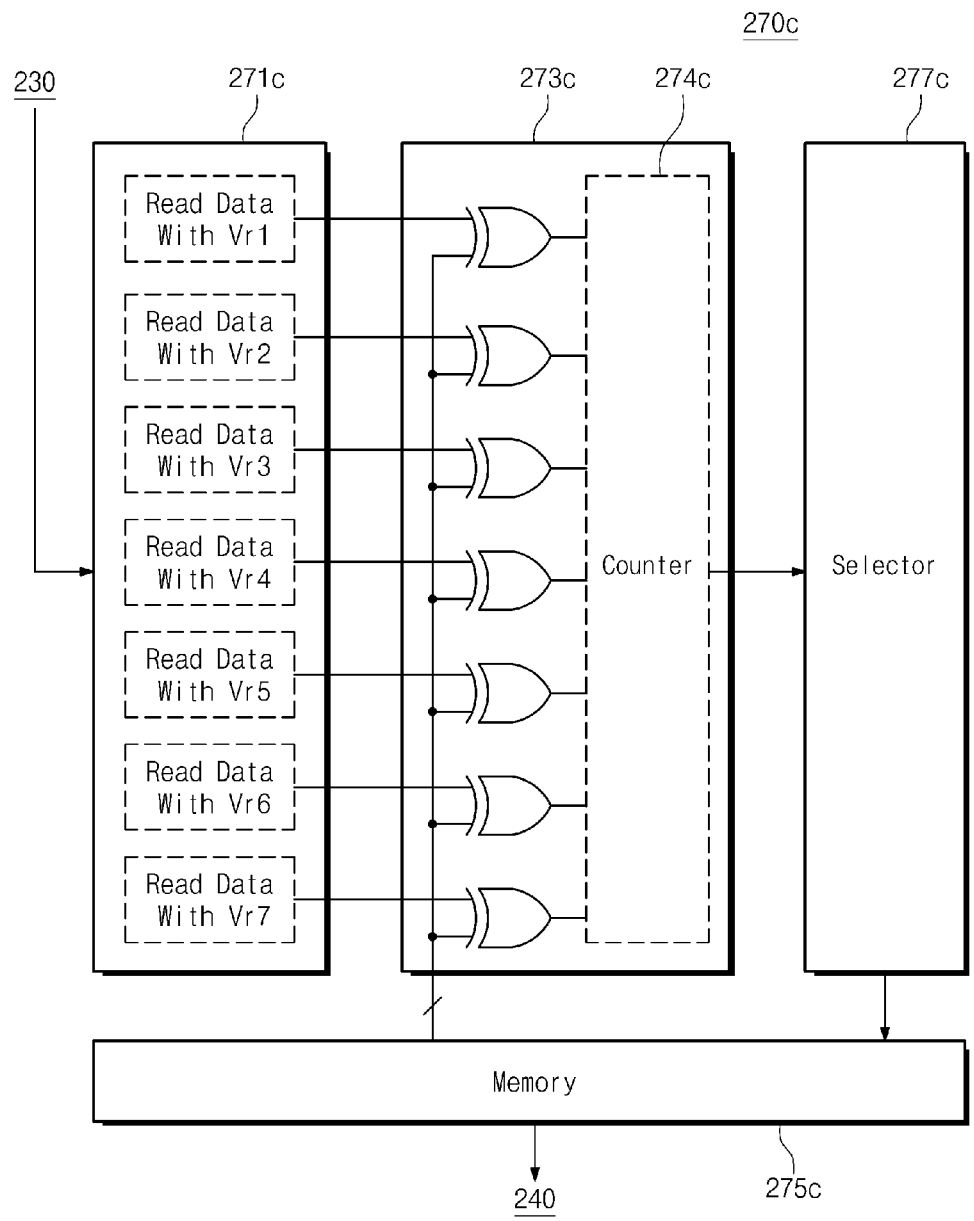
FIG. 8 is a block diagram illustrating yet another embodiment of the fractional read error correcting unit shown in FIG. 5.

FIG. 8 is a block diagram illustrating a third embodiment of fractional read error correcting unit 270. Referring to FIGS. 5 and 8, fractional read error correcting unit 270c comprises a register 271c, a likelihood calculator 273c, a memory 275c and a selector 277c.

Register 271c is configured to receive and store the read data symbol from read and write circuit 230. Memory 275c is configured to store the patterns shown in FIG. 3. Likelihood calculator 273c is configured to calculate likelihoods of the patterns stored in memory 275c based on an observed read data symbol. Such likelihoods may comprise, for instance, Hamming distances between the read data symbol stored in register 271c and the respective patterns stored in memory 275c. Likelihood calculator 273c may alternatively use likelihood functions other than Hamming distance.

Likelihood calculator 273c calculates an exclusive logical sum (XOR) operation on read data symbol bits stored in register 271c and pattern bits stored in memory 275c. The results of the XOR operation are then counted by counter 274c. That is, where a bit of the read data symbol differs from a corresponding bit of a selected pattern of the patterns stored in memory 275c, counter 274c is counted-up. Thus, a count value of counter 274c represents a number of different bits between the read data symbol stored in register 271c and the selected pattern of the patterns stored in memory 275c, i.e., the Hamming distance.

Selector 277c receives the calculated likelihood scores (e.g. the Hamming distances) from likelihood calculator 273c. Based on the received likelihood scores, selector 277c selects one of the patterns stored in memory 275c. For example, selector 277c may select a pattern having a closet Hamming distance of the calculated Hamming distances to the read data symbol stored in register 271c. The selected pattern is transferred to data I/O circuit 240 as the error-corrected symbol.

Figure 9:
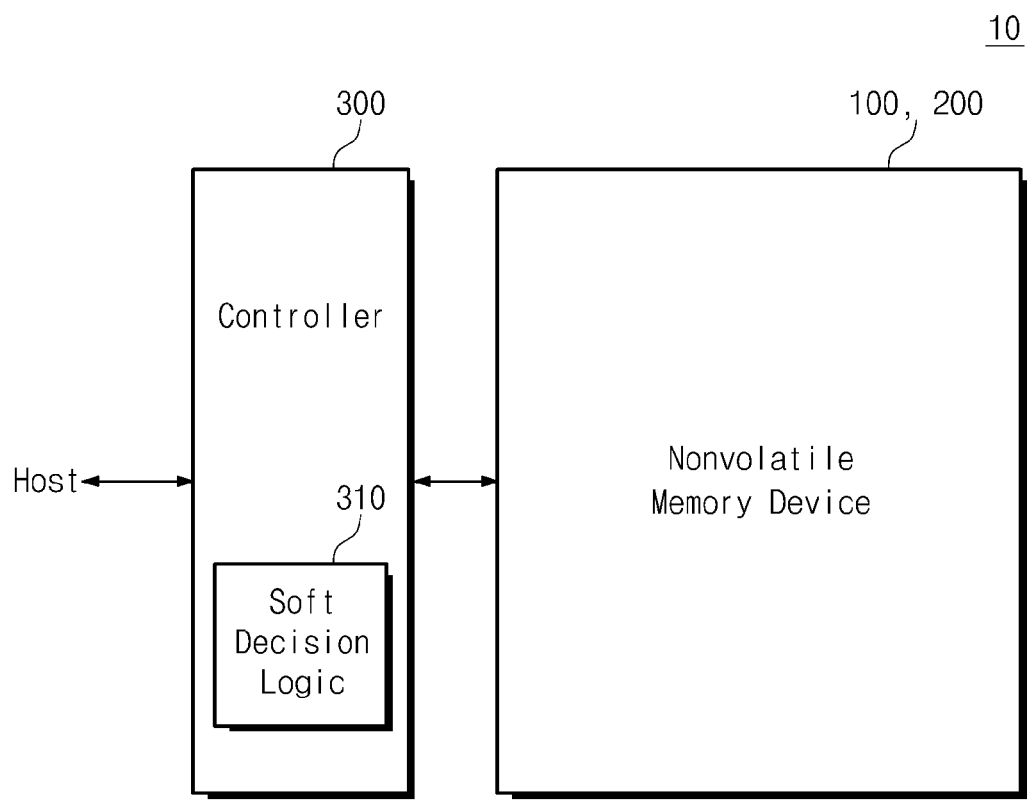
FIG. 9 is a block diagram illustrating a memory system incorporating one of the nonvolatile memory devices shown in FIG. 1 and FIG. 5.

FIG. 9 is a block diagram illustrating a memory system 10 comprising one of nonvolatile memory devices 100 and 200 shown in FIGS. 1 and 5. Referring to FIG. 9, memory system 10 comprises nonvolatile memory device 100 or 200 and a controller 300.

Controller 300 is connected with a host (not shown) and nonvolatile memory device 100 or 200. Controller 300 is configured to access nonvolatile memory device 100 or 200 in response to a request from the host. For example, controller 300 is configured to control read, program and erase operations of nonvolatile memory device 100 or 200. In another embodiment, controller 300 is configured to provide an interface between nonvolatile memory device 100 or 200 and the host. In yet another example, controller 300 is configured to drive firmware for controlling nonvolatile memory device 100 or 200.

In some embodiments, as described in relation to FIGS. 1 and 5, controller 300 is configured to provide control signal CTRL and address ADDR to nonvolatile memory device 100 or 200. Further, controller 300 is configured to exchange data DATA with nonvolatile memory device 100 or 200.

Controller 300 comprises a soft decision logic component 310. Soft decision logic component 310 is configured to execute soft decision of the read data symbol received from nonvolatile memory device 100 or 200. In some embodiments, soft decision logic component 310 is implemented as a digital circuit, an analog circuit, or a combination of digital and analog circuits. In other embodiments, soft decision logic component 310 is implemented as a software executed by control logic component 150. In still other embodiments, soft decision logic component 310 is implemented as a combination of a hardware and a software. Soft decision logic component 310 is described in detail with reference to FIGS. 10 through 13.

Controller 300 typically comprises elements such as a random access memory (RAM), a processing unit, a host interface, and a memory interface. The RAM can be used as a working memory of the processing unit, a cache between nonvolatile memory 100 or 200 and the host, and a buffer memory between the nonvolatile memory 100 or 200 and the host. The processing unit controls various operations of controller 300.

The host interface implements a protocol for executing data exchange between the host and controller 300. Controller 300 is typically configured to communicate with external devices such as the host, using a protocol such as universal serial bus (USB) protocol, multimedia card (MMC) protocol, peripheral component interconnection (PCI) protocol, PCI-express (PCI-E) protocol, advanced technology attachment (ATA) protocol, serial ATA (SATA) protocol, parallel ATA (PATA) protocol, small computer small interface (SCSI) protocol, enhanced small disk interface (ESDI) protocol, integrated drive electronics (IDE) protocol, or enhanced IDE (EIDE) protocol. The memory interface is configured to interface with nonvolatile memory device 100 or 200. The memory interface may be, for instance, a NAND interface or a NOR interface.

Memory system 10 can be configured to further comprise an error correcting block (not shown). The error correcting block may be configured to detect errors of data read from nonvolatile memory device 100 or 200 and correct the detected errors using error correction codes (ECC). The error correcting block is typically provided as an element of controller 300 or of nonvolatile memory device 100 or 200.

In some embodiments, nonvolatile memory device 100 or 200 and controller 300 are integrated into a single semiconductor device. In other embodiments, nonvolatile memory device 100 or 200 and controller 300 are integrated into a semiconductor device to form a memory card. For example, nonvolatile memory device 100 or 200 and controller 300 may be integrated into a semiconductor device to form a memory card, such as a personal computer memory card international association card (PCMCIA card or PC card), a compact flash card (CF card), a smart media card (SM or SMC), a memory stick, a multimedia card (MMC), a reduced size MMC (RS-MMC), a MMC micro, a secure digital card (SD card), a mini SD card, a micro SD card, a SD high capacity (SDHC) card, or a universal flash storage card (UFS card).

In some embodiments, nonvolatile memory device 100 or 200 and controller 300 can be integrated into a semiconductor memory device to form a single semiconductor device, such as a solid state drive (SSD). The SSD typically stores data in a semiconductor chip.

Memory system 10 may be implemented in any of several electronic devices, such as personal computers, mobile computers, ultra mobile PCs (UMPCs), workstations, net-books, personal digital assistants (PDA), portable computers, web tablets, wireless phones, mobile phones, smart phones, digital cameras, digital audio recorders, digital audio players, digital picture recorders, digital picture players, digital video recorders, digital video players, wireless internet devices, home network devices, remote network devices, telematics network devices, or radio frequency identifier (RFID) devices, to name but a few.

Nonvolatile memory device 100 or 200 or memory system 10 can be packaged as one of various types to be subsequently embedded. For example, nonvolatile memory device 100 or 200 or memory system 10 may be packaged in a package on package (POP) configuration, a ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flatpack (TQFP), small outline (SOIC), shrink small outline package (SSOP), thin small outline (TSOP), thin quad flatpack (TQFP), system in package (SIP), multi chip package (MCP), wafer-level fabricated package (WFP), and wafer-level processed stack package (WSP).

Figure 10:
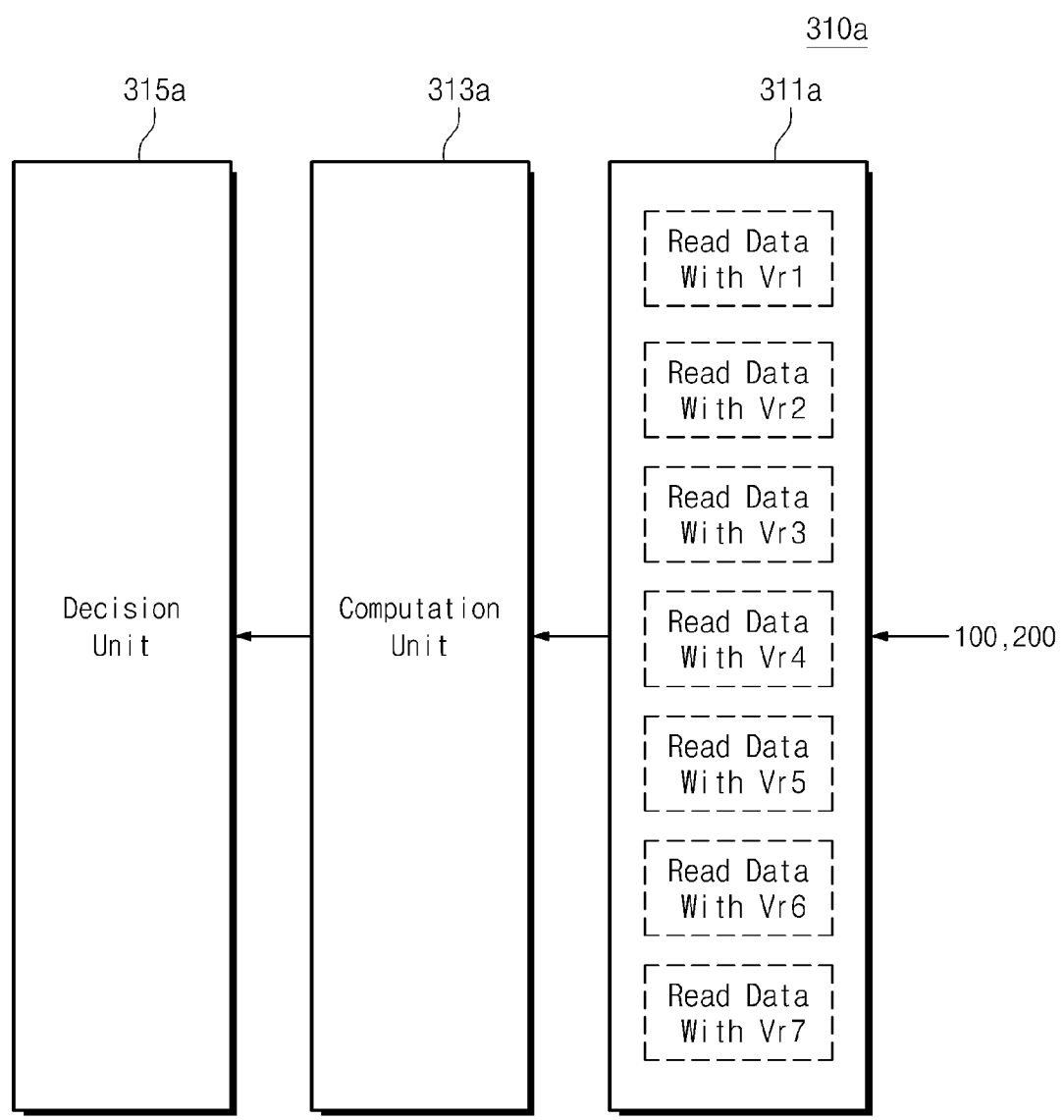
FIG. 10 is a block diagram illustrating an embodiment of a soft decision logic component of a controller of the memory system shown in FIG. 9.

FIG. 10 is a block diagram illustrating a first embodiment of soft decision logic component 310 of controller 300 of memory system 10 shown in FIG. 9. Referring to FIG. 10, soft decision logic component 310a comprises a register 311a, a computation unit 313a and a decision unit 315a.

Register 311a is configured to receive and store the read data symbol from nonvolatile memory device 100 or 200. Computation unit 313a is configured to compute likelihood ratios of the read data symbol. Computation unit 313a converts the read data symbol into a j-bit symbol. For example, where a 3-bit fractional read is executed, computation unit 313a converts the read data symbol into a 3-bit symbol. For example, computation unit 313a converts the ready data symbol to the 3-bit symbol by counting a number of '1' of the read data symbol. The read data symbol and corresponding 3-bit symbol is illustrated in FIG. 11. FIG. 11 illustrates various patterns of the 3-bit symbol corresponding to the patterns shown in FIG. 3.

Then, computation unit 313a computes likelihood ratios of the 3-bit symbol. For example, computation unit 313a may compute logarithmic likelihood ratios of the 3-bit symbol. Moreover, computation unit 313a may compute the likelihood ratios of the converted 3-bit symbol to first state S1 and the second states S2 shown in FIG. 2. In some embodiments, computation unit 313a is configured to store information of a distribution of threshold voltages of memory cells. Based on the stored information, computation unit 313a computes the likelihood ratios of the 3-bit symbol to first state S1 and the second states S2 shown in FIG. 2.

In some embodiments, the information about the distribution is provided by an evaluation. For example, controller 300 may evaluate a distribution of memory cells of nonvolatile memory device 100 or 200, and store the evaluated distribution into computation unit 313a. Where the distribution of the threshold voltages of memory cells changes (e.g. due to degradation of memory cells), the information of the distribution of threshold voltages stored in computation unit 313a is updated. For example, where the distribution of threshold voltages of memory cells changes, controller 300 re-evaluates a distribution of memory cells of nonvolatile memory device 100 or 200. In some embodiments, the re-evaluation is executed based on a degradation (e.g. program and erase cycle) of memory cells of nonvolatile memory device 100 or 200. In some embodiments, the evaluation of the distribution of threshold voltages is performed by the fractional read.

In some embodiments, information about the distribution is provided by a form of predetermined table. For example, computation unit 313a may compute the likelihood ratios of the 3-bit symbol based on the predetermined table. The predetermined table may comprise normalized change information of the distribution of threshold voltages according to a degradation of memory cells.

Computation unit 313a transfers the calculated likelihood ratios to decision unit 315a. Decision unit 315a determines a data of the selected memory cell based on the calculated likelihood ratios. For example, decision unit 315a selects one, having higher likelihood ratio of the calculated likelihood ratios, of the first and second states S1 and S2, and determines the selected state as a data of the selected memory cell.

Soft decision logic component 310a is configured to count a number of '1' of the read data symbol and compute likelihoods of the counted value to the first and second states S1 and S2. Based on the computed likelihoods, soft decision logic component 310a determines a data value of the selected memory cell. The state most similar to observed data stored in the selected memory cell among states being written to memory cells, is determined as the value of the selected memory cell.

Figure 12:
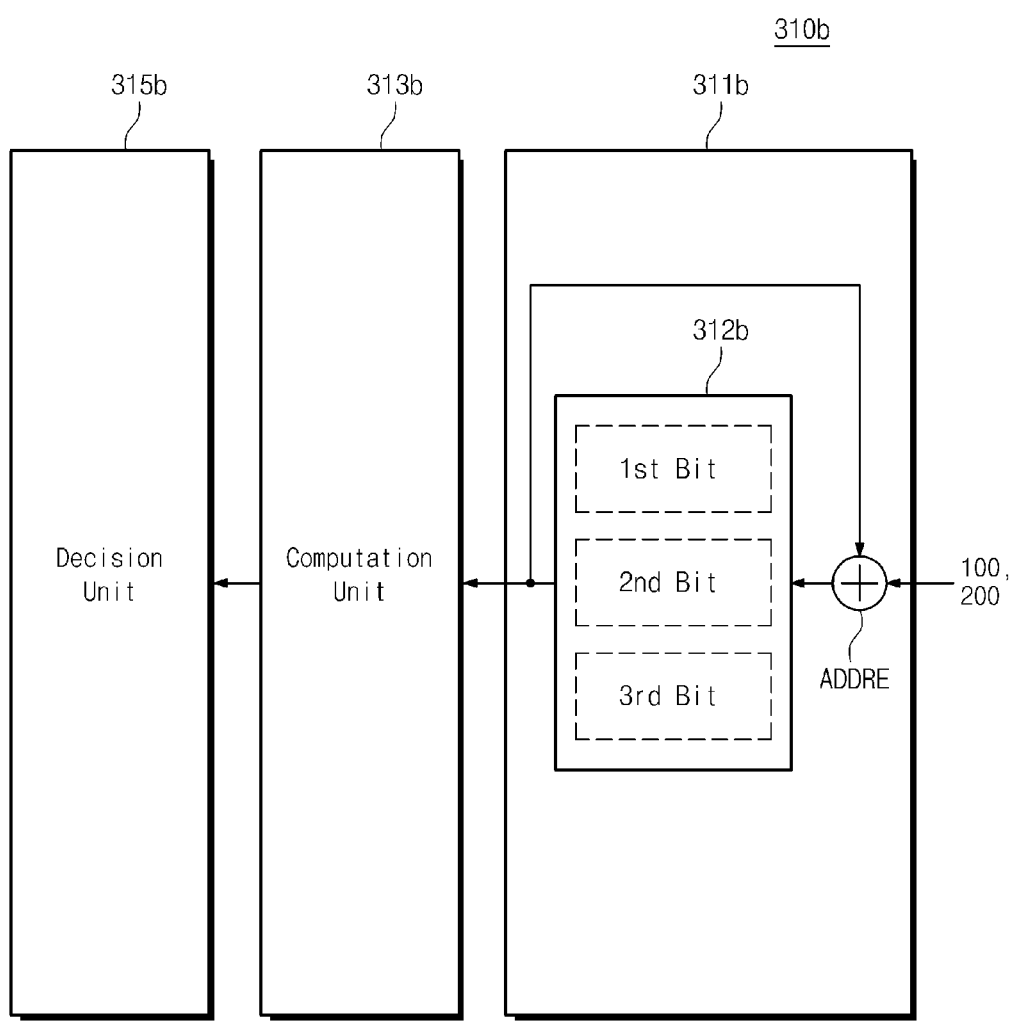
FIG. 12 is a block diagram illustrating another embodiment of the soft decision logic component shown in FIG. 9.

FIG. 12 is a block diagram illustrating another embodiment of soft decision logic component 310 shown in FIG. 9. Referring to FIG. 12, soft decision logic component 310b comprises an accumulator 311b, a computation unit 313b and a decision unit 315b.

Accumulator 311b is configured to receive and store the read data symbol from nonvolatile memory device 100 or

200. While the read data symbol is received, accumulator 311*b* counts a number of '1' of a sequentially received bits of the read data symbol to generate the 3-bit symbol. In some embodiments, accumulator 311*b* comprises an adder ADDER and a register 312*b*. Register 312*b* is configured to store j-bits. In one example, register 312*b* stores 3-bits when the 3-bit fractional read is performed. In this example, an initial value of register 312*b* is '000'. Adder ADDER adds each bit sequentially received from nonvolatile memory device 100 or 200 with the 3-bit stored in register 312*b*. That is, where receiving the read data symbol is completed, register 312*b* stores a number of '1' of the read data symbol in the form of a binary 3-bit data. Values of register 312*b* represent the 3-bit symbol corresponding to the received read data symbol.

As described in relation to FIGS. 10 and 11, computation unit 313*b* is configured to compute the likelihood ratios of the 3-bit symbol. Decision unit 315*b* is configured to determine a data of the selected memory cell based on the computed likelihood ratios.

As described above, while bits of the read data symbol are sequentially received, soft decision logic component 310*b* counts a number of '1's and computes likelihood ratios of the counted value given various patterns or vice versa. Soft decision logic component 310*b* determines a data value of the selected memory cell based on the computed likelihood ratios. Compared with soft decision logic component 310*a* shown in FIG. 10, soft decision logic component 310*b* is configured to execute the soft decision using lower storage capacity.

Figure 13:
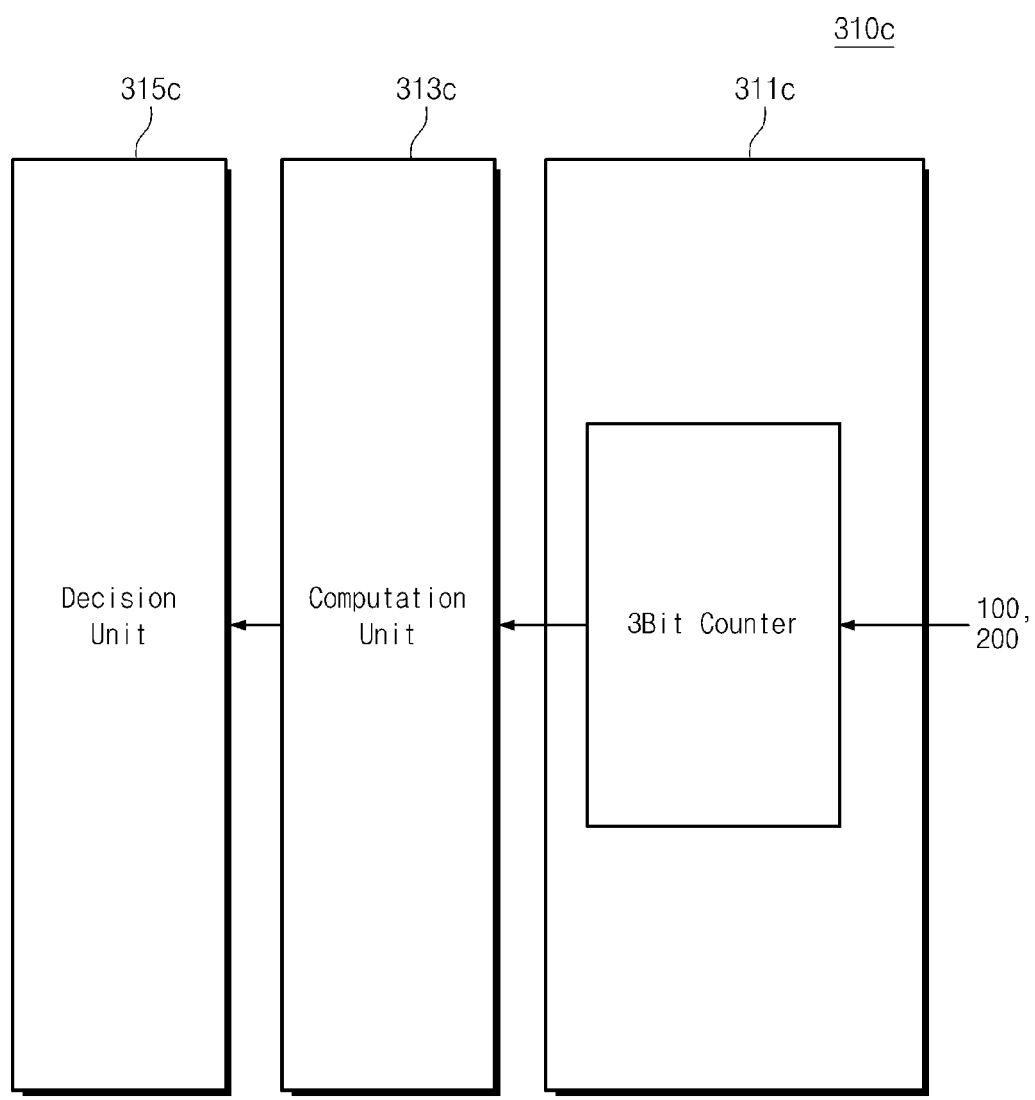
FIG. 13 is a block diagram illustrating yet another embodiment of the soft decision logic component shown in FIG. 9.

FIG. 13 is a block diagram illustrating yet another embodiment of soft decision logic component 310 shown in FIG. 9. In this embodiment, soft decision logic component 310*c* comprises a accumulator 311*c*, a computation unit 313*c* and a decision unit 315*c*. Except for accumulator 311*c*, which is formed with a j-bit counter (e.g. 3-bit counter), soft decision logic component 310*c* is formed identical to soft decision logic component 310*b* described referring to FIG. 10. Thus, further description will be omitted to avoid redundancy.

FIGS. 1 through 8 illustrate various methods and structures for correcting errors of the read data symbol corresponding to a selected memory cell. The embodiments of FIGS. 1 through 8 could also be extended to correct errors in read data symbols in a plurality of selected memory cells read simultaneously.

In some embodiments, fractional read error correcting unit 270 shown in FIG. 5 is configured to sequentially receive the read data symbols corresponding to the selected memory cells read simultaneously. Fractional read error correcting unit 270 is configured to correct errors of the sequentially received read data symbols respectively.

In other embodiments, "m" selected memory cells ("m" is a positive integer) are read simultaneously by "m" fractional read error correcting units. The "m" fractional read error correcting units are configured to receive respective read data symbols corresponding to the "m" selected memory cells. Each fractional read error correcting unit is configured to correct errors in the received read data symbol.

In yet other embodiments, "m" selected memory cells are read simultaneously by "h" fractional read error correcting units, where "h" is a positive integer less than "m". The read data symbols corresponding to the "m" selected memory cells are divided into "h" groups. The "h" fractional read error correcting units may be configured to receive the respective read data symbol groups. The read data symbols corresponding to each read data symbol group are transferred to corresponding fractional read error correcting unit. Each fractional read error correcting unit is configured to correct errors of the read data symbols of corresponding read data symbol group.

FIGS. 9 through 13 illustrate methods and structures for implementing soft decision logic for data stored in a selected memory cell. These methods and structures can be extended to implement soft decision logic for a plurality of selected memory cells. As described above, in some embodiments, a soft decision unit implements soft decision logic on sequentially received data. In other embodiments, a plurality of soft decision units implement soft decision logic on data received in parallel. In still other embodiments, a plurality of soft decision units divide data from selected memory cells into groups and performs the soft decisions simultaneously on groups and sequentially in subgroups within the groups.

Figure 14:
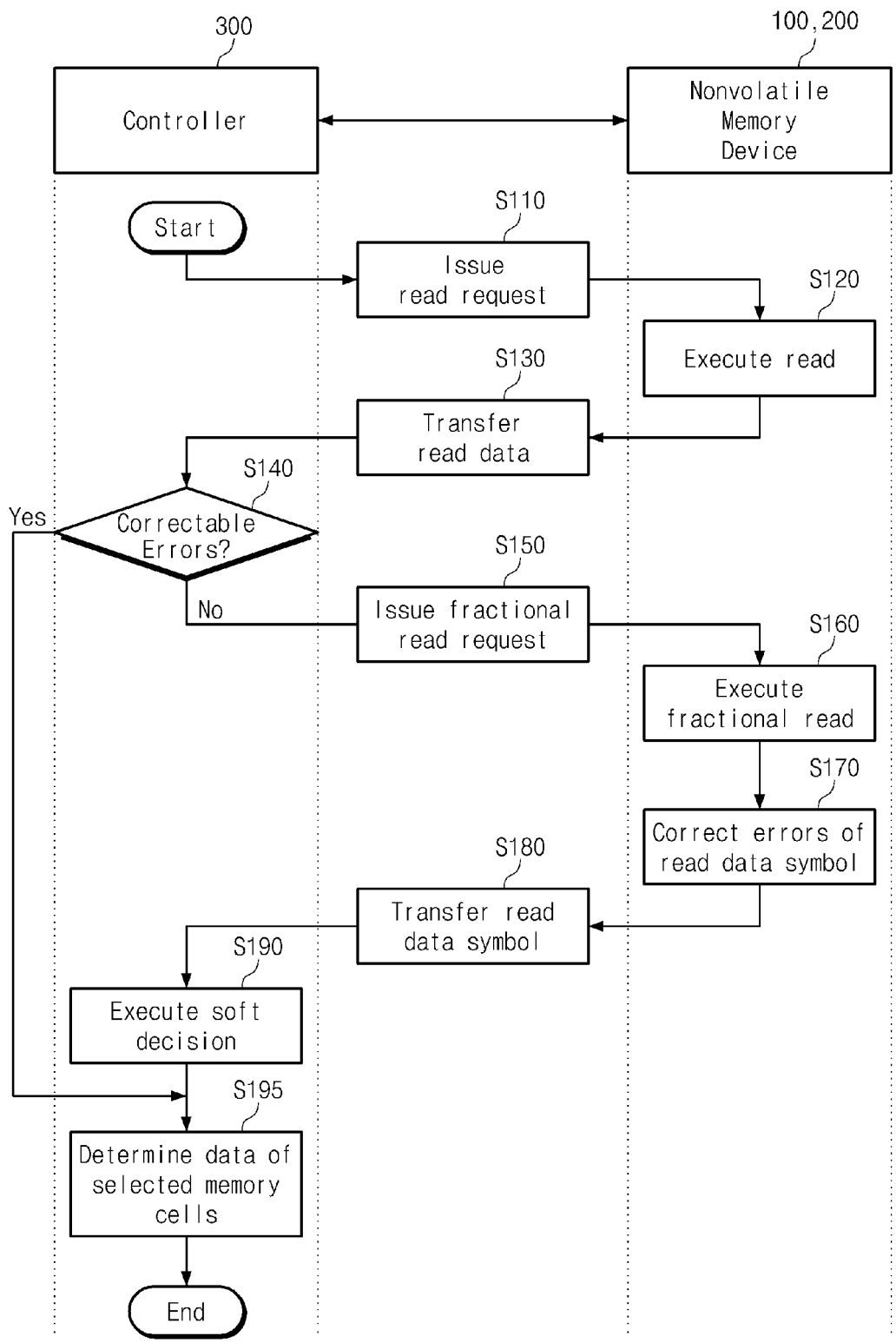
FIG. 14 is a flow chart illustrating operations of a memory system including a nonvolatile memory device and/or controller such as those illustrated in FIGS. 1 through 13.

FIG. 14 is a flow chart illustrating a method of operating memory system 10 comprising nonvolatile memory device 100 or 200 and controller 300 and described in relation to FIGS. 1 through 13. Referring to FIG. 14, in a step S110, controller 300 transfers a read request to nonvolatile memory device 100 or 200. In a step S120, nonvolatile memory device 100 or 200 executes a read operation in response to the received read request from controller 300. For example, read and write circuit 130 or 230, described in relation to FIG. 1 and FIG. 5, reads selected memory cells.

In a step S130, the read data is transferred from nonvolatile memory device 100 or 200 to controller 300. In a step S140, controller 300 determines whether errors in the read data received from nonvolatile memory device 100 or 200 are correctable. Where errors of the read data are correctable, controller 300 corrects errors in the read data. Then in a step S195, controller 300 determines the error corrected data as the data of the selected memory cells.

In step S140, if errors of the read data are not correctable, a step S150 is performed. In step S150, controller 300 transfers a fractional read request to nonvolatile memory device 100 or 200. In a step S160, nonvolatile memory device 100 or 200 executes the fractional read in response to the fractional read request. The fractional read is executed as described in relation to FIGS. 1 through FIG. 8. Thus, further description of this operation is omitted to avoid redundancy. When the fractional read is performed, the read data symbol is obtained.

In a step S170, nonvolatile memory device 100 or 200 corrects errors of the read data symbol. An operation of correcting errors of the read data symbol is performed as described in relation to FIGS. 5 through 8. Thus, further description of this operation is omitted to avoid redundancy. Where step S170 is performed, the error-corrected symbol is obtained. In some embodiments, where nonvolatile memory device 100 does not provide a function of correcting the fractional read error as described referring to FIG. 1, step S170 is skipped.

In a step S180, the read data symbol is transferred from nonvolatile memory device 100 or 200 to controller 300. In some embodiments, where nonvolatile memory device 100 does not provide the function of correcting the fractional read error as described referring to FIG. 1, the transferred symbol is an error-not-corrected symbol. In other embodiments, where nonvolatile memory device 200 provides the function of correcting the fractional read error as described referring to FIG. 5, the transferred symbol is the error-corrected symbol. A symbol transferred during step S180 is referred to as a 'read data symbol', which encompasses both symbols with uncorrected errors, as well as symbols with errors corrected.

In step S190, controller 300 executes the soft decision based on the read data symbol received from nonvolatile memory device 100 or 200. The soft decision is performed as described in relation to FIGS. 9 through 13. Thus, further description of this operation is omitted to avoid redundancy.

In a step S195, controller 300 determines data of the selected memory cells. An operation for determining data stored in the selected memory cells is described with reference to FIGS. 9 through 12. Thus, further description of this operation is omitted to avoid redundancy.

Operations corresponding to steps S110 through S140 and S190 can be viewed as a hard decision for reading selected memory cells once and determining data stored in the selected memory cells. Operations corresponding to steps S150 through S195 constitute a soft decision. That is, memory system 10 can be implemented to perform a hard decision relative to selected memory cells, and to further perform a soft decision when a result of the hard decision is erroneous. In some embodiments, memory system 10 can be implemented to perform the soft decision, comprising steps S150 through S195, without performing a hard decision comprising steps S110 through S140 and step S195.

Figure 15:
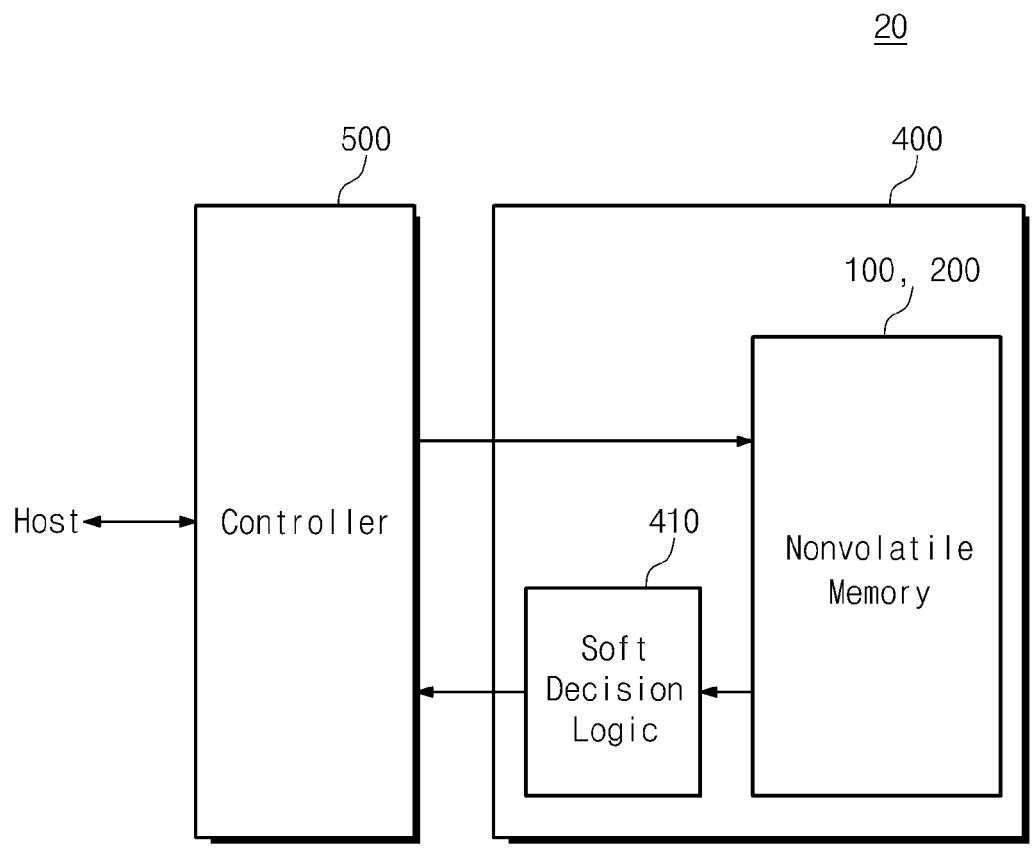
FIG. 15 is a block diagram illustrating another memory system comprising one of the nonvolatile memory devices shown in FIG. 1 and FIG. 5.

FIG. 15 is a block diagram illustrating a second embodiment of memory system 10 shown in FIG. 9. Referring to FIG. 15, memory system 20 comprises a nonvolatile memory device 400 and a controller 500.

Nonvolatile memory device 400 comprises nonvolatile memory 100 or 200 and a soft decision logic component. Nonvolatile memory 100 or 200 functions as described with reference to FIGS. 1 through 5. Soft decision logic component 410 is composed similar to soft decision logic component 310 as described in relation to FIGS. 9 through 13. Controller 500 has a structure identical to controller 300 as described in relation to FIGS. 9 through 13, except for the absence of soft decision logic component 410. That is, when comparing memory system 20 with memory system 10 shown in FIG. 9, soft decision logic component 410 is provided in nonvolatile memory device 400. That is, nonvolatile memory device 400 is configured to determine data of the selected memory cells by performing the soft decision. Controller 500 is configured to receive soft-decided data for the selected memory cells from nonvolatile memory device 400.

Where soft decision logic component 410 is provided in nonvolatile memory device 400, step S180 of FIG. 14 is skipped. Steps S190 and S195 are performed by nonvolatile memory device 400. Then, nonvolatile memory device 400 transfers the soft-decided data of the selected memory cells to controller 500.

Where soft decision logic component 410 is provided in nonvolatile memory device 400, nonvolatile memory device 400 transfers the soft-decided data to controller 500. This reduces the time of transferring data to controller 500 compared with the time required to transfer the read data symbol to controller 500. Thus, read performance of the memory system 20 comprising nonvolatile memory device 400 is improved.

Figure 16:
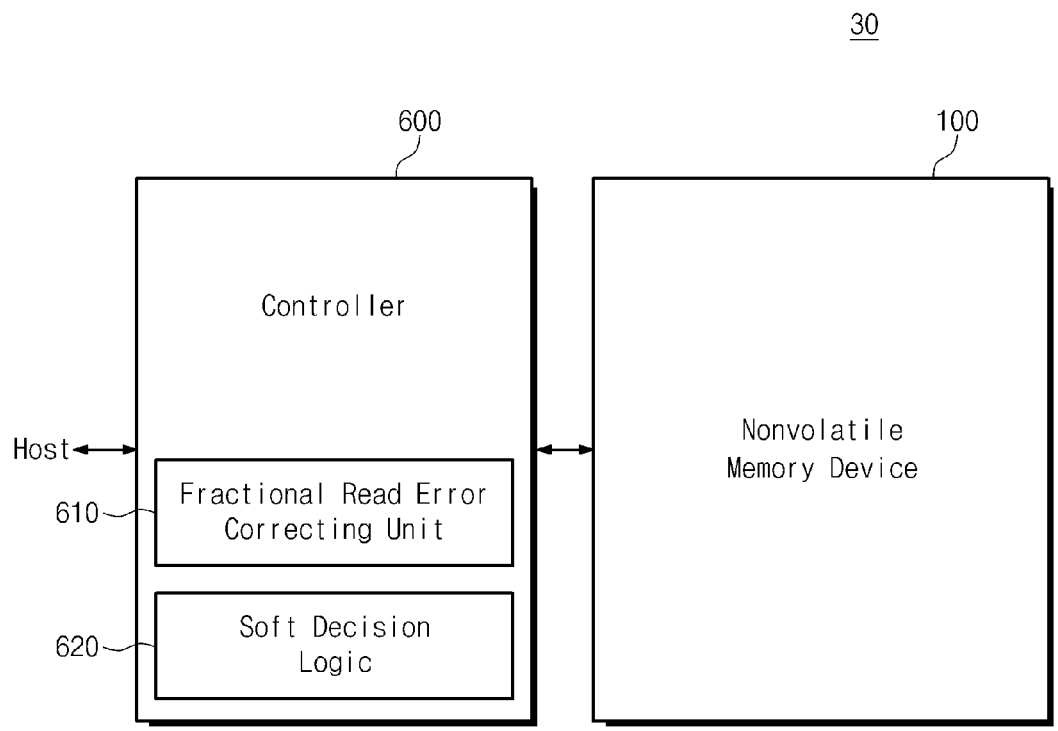
FIG. 16 is a block diagram illustrating yet another memory system comprising one of the nonvolatile memory devices shown in FIG. 1 and FIG. 5.

FIG. 16 is a block diagram illustrating a memory system 30, which is similar to memory system 10 shown in FIG. 9. Referring to FIG. 16, memory system 30 comprises a nonvolatile memory device 100 and a controller 600. Nonvolatile memory device 100 is implemented as described in relation to FIG. 1. Controller 600 is similar to controller 300 described in relation to FIG. 9, except for the addition of a fractional read error correcting unit 610. That is, comparing memory system 30 with memory system 10 shown in FIG. 9, controller 600 further comprises fractional read error correcting unit 610. As such, controller 600 is configured to receive the read data symbol from nonvolatile memory device 100. Then, the controller 600 is configured to correct errors of the read data symbol, and perform the soft decision based on the error-corrected symbol.

Where fractional read error correcting unit 610 is provided in controller 600, step S170 shown in FIG. 14 is performed by controller 600 after step S180.

Figure 17:
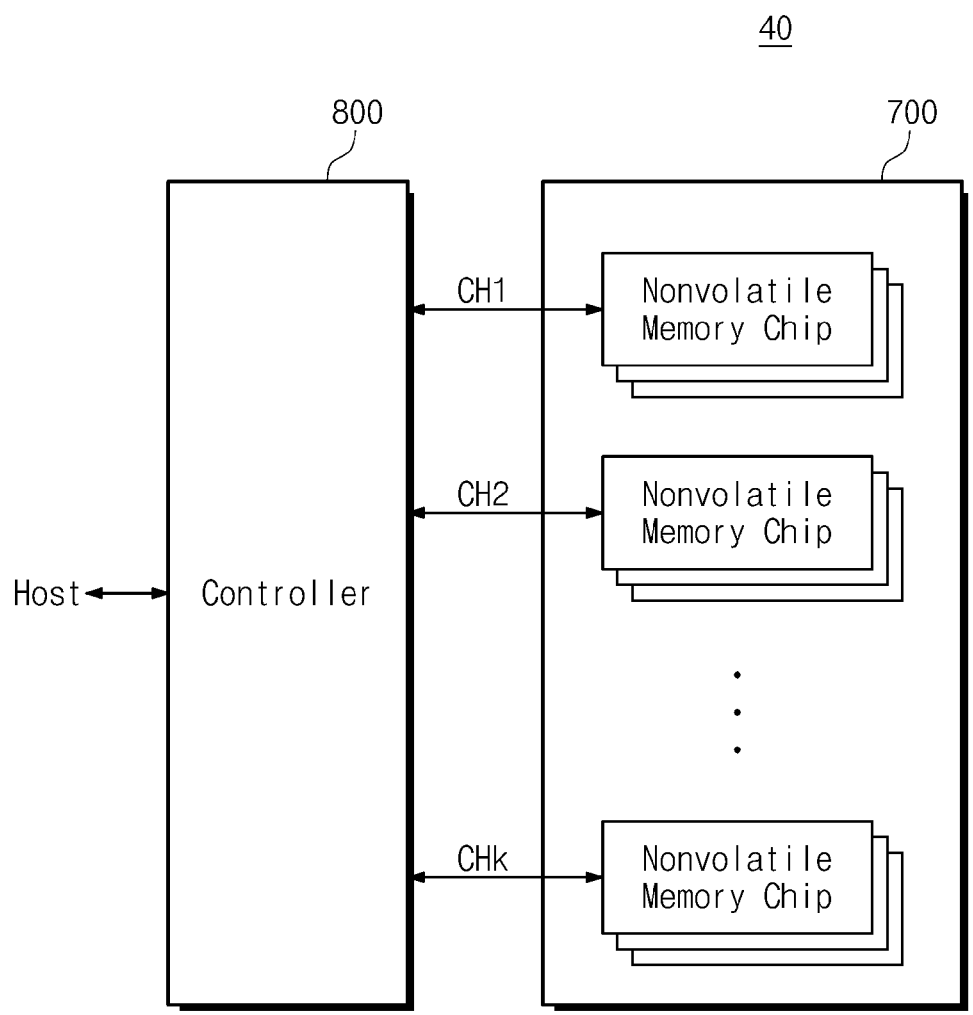
FIG. 17 is a block diagram illustrating still another memory system comprising one of the nonvolatile memory devices shown in FIG. 1 and FIG. 5.

FIG. 17 illustrates a memory system 40, which is also similar to memory system 10 shown in FIG. 9. Referring to FIG. 17, memory system 40 comprises a nonvolatile memory device 400 and a controller 800. Nonvolatile memory device 700 comprises a plurality of memory chips. The plurality of nonvolatile memory chips are divided into a plurality of groups. Each group of the plurality of nonvolatile memory chips is configured to communicate with controller 800 via a common channel. In FIG. 17, the plurality of nonvolatile memory chips communicate with the controller via first through k-th channels CH1 through CHk. Each nonvolatile memory chip in memory system 40 is similar to nonvolatile memory device 100, 200 and 400 as described in relation to FIG. 1, 5 or 15. Controller 800 is similar to controller 300, 500 or 600 as described in relation to FIGS. 9, 15 and 16.

Figure 18:
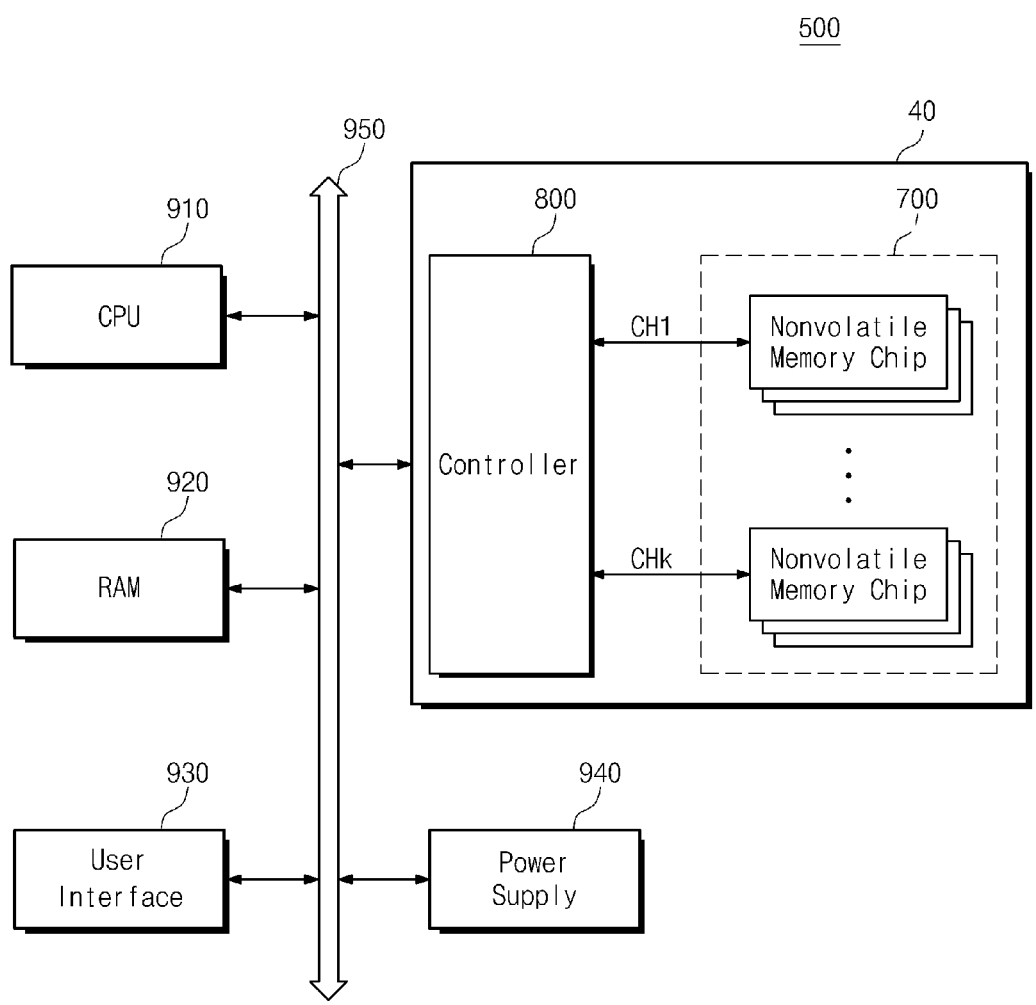
FIG. 18 is a block diagram illustrating a computing system including the memory system shown in FIG. 17.

FIG. 18 is a block diagram illustrating a computing system 900 comprising memory system 40 shown in FIG. 17. Referring to FIG. 18, computing system 900 comprises a central processing unit 910, a RAM 920, a user interface 930, a power supply 940 and memory system 40.

Memory system 40 is electrically connected to central processing unit 910, RAM 920, user interface 930, and power supply 940 via system bus 950. Data provided via user interface 930 or processed by central processing unit 910 is stored in memory system 40. Memory system 40 comprises controller 800 and nonvolatile memory device 700.

In FIG. 18, nonvolatile memory device 700 is connected to system bus 950 via controller 800. However, nonvolatile memory device 700 can be implemented to be connected directly to system bus 950. In this case, the functions of controller 300, 500 or 600 described with reference to FIGS. 9 through 17 are executed by central processing unit 910.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A nonvolatile memory device, comprising: a memory cell array configured to store one or more bits per memory cell; a read and write circuit configured to access the memory cell array; a control logic component configured to control the read and write circuit to execute a fractional read operation to determine a data stored in a selected memory cell of the memory cell array, the fractional read operation including sequential execution of a plural number of read operations on the selected memory cell using respectively different read voltages to sequentially output respective read data bits, wherein the sequentially output read data bits constitute a read data symbol; and an error correcting unit configured to generate an error-corrected symbol by correcting an error in the read data symbol based on a pattern of the read data symbol.

2. A nonvolatile memory device, comprising:
a memory cell array configured to store one or more bits per memory cell;
a read and write circuit configured to access the memory cell array;
a control logic component configured to control the read and write circuit to sequentially execute read operations on a selected memory cell at least twice to output a read data symbol; and
an error correcting unit configured to generate an error-corrected symbol by correcting an error in the read data symbol based on a pattern of the read data symbol,
wherein a read voltage applied to the selected memory cell is adjusted during the read operations, and
wherein the error correcting unit is configured to detect a transition bit of the read data symbol and to correct the error based on the detected transition bit.

3. The nonvolatile memory device of claim 2, wherein the error correcting unit is configured to correct the detected transition bit of the read data symbol to a first value, and bits following the detected transition bit of the read data symbol to a second value.

4. The nonvolatile memory device of claim 2, wherein the error correcting unit is configured to execute an AND operation on an (n−1)th bit, a complement of an n-th bit, and a complement of an (n+1)th bit of the read data symbol to detect the transition bit.

5. The nonvolatile memory device of claim 2, wherein the error correcting unit is configured to execute an AND operation on a complement of an (n−1)th bit, an n-th bit, and an (n+1)th bit of the read data symbol to detect the transition bit.

6. The nonvolatile memory device of claim 2, wherein the error correcting unit is configured to store predetermined symbols, compare the read data symbol with the respective predetermined symbols, and correct an error in the read data symbol based on the results of the comparison.

7. The nonvolatile memory device of claim 6, wherein the predetermined symbols correspond to symbols read during read operations in the absence of errors.

8. The nonvolatile memory device of claim 6, wherein the error correcting unit is configured to estimate a likelihood of the read data symbol given the predetermined symbols, select one of the predetermined symbols based on the estimated likelihood, and output the selected symbol as the error-corrected symbol.

9. The nonvolatile memory device of claim 6, wherein the error correcting unit is configured to estimate a Hamming distance between the read data symbol and the respective predetermined symbols, select one of the predetermined symbols having a closest Hamming distance to the read data symbol, and output the selected symbol as the error-corrected symbol.

10. The nonvolatile memory device of claim 9, wherein the error correcting unit is configured to execute an XOR operation on bits of the read data symbol and bits of the respective predetermined symbols, and count a result of the XOR operation to generate the Hamming distance.

11. A memory system comprising: a nonvolatile memory device; and a controller configured to control the nonvolatile memory device, wherein the nonvolatile memory device comprises: a memory cell array configured to store one or more bits per memory cell; a read and write circuit configured to access the memory cell array; a control logic component configured to control the read and write circuit to execute a fractional read operation to determine a data stored in a selected memory cell of the memory cell array, the fractional read operation including
sequential execution of a plural number of read operations on the selected memory cell using respectively different read voltages to sequentially output respective read data bits, wherein the sequentially output read data bits constitute a read data symbol; and
an error correcting unit configured to generate an error-corrected symbol by correcting an error in the read data symbol based on a pattern of the read data symbol;
wherein the controller comprises a soft decision logic component configured to determine data stored in the selected memory cell by performing a soft decision on the error-corrected symbol.

12. The memory system of claim 11, wherein the soft decision logic component is configured to receive the error-corrected symbol, each bit of which has one of a first value and a second value, count a number of bits with the first value in the received error-corrected symbol, and estimate a likelihood of the counted number.

13. The memory system of claim 11, wherein the soft decision logic component is configured to count a number of bits having a first value among a plurality of sequentially received bits of the error-corrected symbol, each bit of which has one of the first value and a second value, and estimate a likelihood of the counted number.

14. The memory system of claim 13, wherein the soft decision logic component comprises:
a buffer configured to store the number of bits having the first value;
an adder configured to increment the number stored in the buffer based on the respective values of received bits.

15. The memory system of claim 11, wherein the nonvolatile memory device and the controller compose a solid state drive.

16. The memory system of claim 11, wherein the nonvolatile memory device and the controller compose a memory card.

17. A method of reading data from a nonvolatile memory device, the method comprising:
executing a fractional read operation a selected memory cell of the memory device a data stored in the selected memory cell, the fractional read operation including sequential execution of a plural number of read operations on the selected memory cell using respectfully different read voltages to sequentially output respective read data bits, wherein the sequentially output read data bits constitute a read data symbol; and
correcting an error in the read data symbol to obtain a error-corrected symbol, and determining the data stored in the selected memory cell from the error-corrected symbol.

18. The method of claim 17, wherein determining data stored in the selected memory cell includes performing a soft decision on the error-corrected symbol.

* * * * *